(12) United States Patent
Karasawa

(10) Patent No.: US 12,546,007 B2
(45) Date of Patent: Feb. 10, 2026

(54) PARAMETER SETTING METHOD AND SUBSTRATE PROCESSING APPARATUS

(71) Applicant: Tokyo Electron Limited, Tokyo (JP)

(72) Inventor: Hiroyuki Karasawa, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 11 days.

(21) Appl. No.: 18/218,484

(22) Filed: Jul. 5, 2023

(65) Prior Publication Data
US 2024/0011161 A1    Jan. 11, 2024

(30) Foreign Application Priority Data

Jul. 11, 2022 (JP) .................. 2022-111357

(51) Int. Cl.
| | |
|---|---|
| *C23C 16/52* | (2006.01) |
| *C23C 16/40* | (2006.01) |
| *C23C 16/458* | (2006.01) |
| *C23C 16/46* | (2006.01) |

(52) U.S. Cl.
CPC ............ *C23C 16/52* (2013.01); *C23C 16/401* (2013.01); *C23C 16/4584* (2013.01); *C23C 16/46* (2013.01)

(58) Field of Classification Search
CPC ... C23C 16/52; C23C 16/401; C23C 16/4584; C23C 16/46
See application file for complete search history.

(56) References Cited

U.S. PATENT DOCUMENTS

| | | | |
|---|---|---|---|
| 2013/0260039 A1* | 10/2013 | Takenaga | B05C 9/14 427/314 |
| 2015/0227139 A1* | 8/2015 | Yamamoto | G06N 5/022 700/110 |

FOREIGN PATENT DOCUMENTS

WO    2014/065269 A1    5/2014

* cited by examiner

*Primary Examiner* — Kelly M Gambetta
(74) *Attorney, Agent, or Firm* — Venjuris, P.C.

(57) ABSTRACT

A parameter setting method includes: (a) acquiring a first index indicating a thermal effect of a temperature control of a temperature adjustment unit on a processing container of a substrate processing apparatus when no film is present on an inner surface of the processing container; (b) acquiring a film thickness of a film on the inner surface of the processing container, and a second index indicating a thermal effect of the temperature control of the temperature control unit on the processing container when the film is present on the inner surface of the processing container; and (c) acquiring a third index indicating a thermal effect of the temperature control of the temperature adjustment unit on the processing container when a film is formed on the inner surface of the processing container, and estimating a film thickness of the film formed on the inner surface of the processing container.

8 Claims, 9 Drawing Sheets

PARAMETER SETTING METHOD AND SUBSTRATE PROCESSING APPARATUS

CROSS-REFERENCE TO RELATED APPLICATIONS

The present application is based on and claims priority from Japanese Patent Application No. 2022-111357, filed on Jul. 11, 2022, with the Japan Patent Office, the disclosure of which is incorporated herein in its entirety by reference.

TECHNICAL FIELD

The present disclosure relates to a parameter setting method and a substrate processing apparatus.

BACKGROUND

In a batch-type substrate processing apparatus for forming films on a plurality of substrates accommodated inside a processing container, parameters of process conditions, such as the temperature of each substrate or the flow rate of a processing gas, are set such that film thicknesses of individual substrates are made uniform. WO 2014/065269 discloses a correction value calculation method of calculating a correction value of a control parameter in consideration of a state fluctuation of a substrate processing apparatus by using a model representing the relationship between parameters such as each substrate temperature and a processing gas flow rate, and the film thickness of each substrate (performance index).

In this type of substrate processing apparatus, for example, when new process conditions are started, an operation of performing substrate processing for parameter adjustment and then measuring the film thickness of each substrate is repeated so as to search for a parameter such as a temperature that makes film thicknesses of individual substrates uniform.

SUMMARY

According to an aspect of the present disclosure, a parameter setting method includes: (a) providing a substrate processing apparatus including: a processing container that performs a substrate processing to form a film on each of a plurality of substrates; and a temperature controller that controls temperatures of the substrates accommodated within the processing container, for each of zones set in advance; (b) acquiring, as reference information, a first index indicating a thermal effect of a temperature control of the temperature controller on the processing container in a state where the film is absent on an inner surface of the processing container; (c), after (b), acquiring, as the reference information, a film thickness on the inner surface of the processing container, and a second index indicating a thermal effect of the temperature control of the temperature controller on the processing container in a state where the film is present on the inner surface of the processing container, for each of the zones; and (d), after (c), acquiring a third index indicating a thermal effect of the temperature control of the temperature controller on the processing container when the film is formed on the inner surface of the processing container by the substrate processing, for each of the zones, and estimating a film thickness of the film formed on the inner surface of the processing container based on the third index and the reference information.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
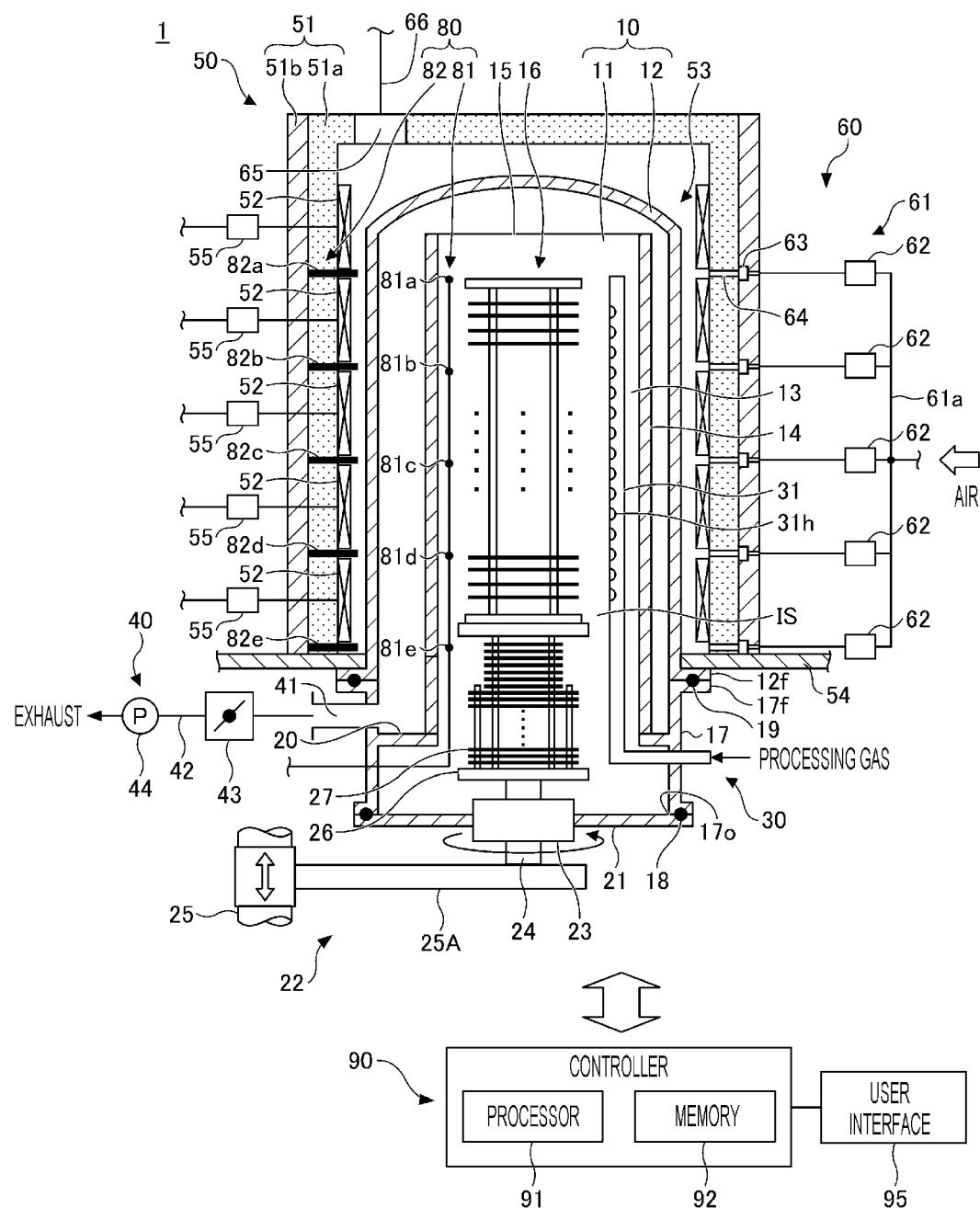
FIG. 1 is an explanatory view schematically illustrating the configuration of a heat treatment apparatus according to one exemplary embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for carrying out the present disclosure will be described with reference to drawings. In the drawings, the same components are denoted by the same reference numerals, and redundant descriptions thereof may be omitted in some cases.

As illustrated in FIG. 1, a substrate processing apparatus 1 according to one exemplary embodiment is configured as a vertical film forming apparatus in which substrates W are arranged side by side in the vertical direction (up and down direction), and substrate processing is performed to form a predetermined film on the surface of the substrate W. Examples of the substrate W may include a semiconductor substrate such as a silicon wafer or a compound semiconductor wafer, and a glass substrate.

The substrate processing apparatus 1 includes a processing container 10 that accommodates a plurality of substrates W, and a temperature adjustment unit 50 disposed around the processing container 10. Further, the substrate processing apparatus 1 includes a controller 90 that controls the operation of each component of the substrate processing apparatus 1.

The processing container 10 is formed in a tubular shape extending in the vertical direction. Inside the processing container 10, an internal space IS is formed in which the substrates W is able to be arranged side by side in the vertical direction. The processing container 10 includes, for example, a cylindrical inner cylinder 11 having an open upper end (ceiling) and an open lower end, and a cylindrical outer cylinder 12 disposed outside the inner cylinder 11 and having a ceiling and an open lower end. The inner cylinder 11 and the outer cylinder 12 are made of a heat resistant material such as quartz, and have a double structure in which the cylinders are coaxially arranged. The processing container 10 is not limited to the double structure, and may have a single tube structure, or a multiple structure composed of three or more tubes.

The inner cylinder 11 has a diameter larger than the diameter of each substrate W, and has an axial length by which the substrates W may be accommodated (for example, above the placement height of the substrates W). Inside the inner cylinder 11, a processing space (one portion of the internal space IS) is formed in which a gas is discharged to each accommodated substrate W and substrate processing is performed. On the upper end of the inner cylinder 11, an opening 15 is formed, which communicates with the processing space, and allows a gas to flow out toward a circulation space (another portion of the internal space IS) between the inner cylinder 11 and the outer cylinder 12.

Further, at a predetermined circumferential position of the inner cylinder 11, a housing portion 13 that accommodates a gas nozzle 31 is formed along the vertical direction. As an example, the housing portion 13 is formed inside a convex portion 14 formed by projecting a part of the side wall of the inner cylinder 11 outwards in the radial direction. Instead of the opening 15 on the upper end, the inner cylinder 11 may have a vertically elongated opening (not illustrated) at a predetermined position of the peripheral wall (for example, on the opposite side of the housing portion 13 across the central axis).

The outer cylinder 12 has a larger diameter than the inner cylinder 11 and covers the inner cylinder 11 in a non-contact manner, and then constitutes the outer shape of the processing container 10. The circulation space between the inner cylinder 11 and the outer cylinder 12 is formed above and on the lateral side of the inner cylinder 11, and allows the upwardly moving gas to flow downwards in the vertical direction.

The lower end of the processing container 10 is supported by a cylindrical manifold 17 made of stainless steel. For example, the manifold 17 has a manifold side flange 17$f$ on the upper end thereof. The manifold side flange 17$f$ fixes and supports an outer-cylinder side flange 12$f$ formed at the lower end of the outer cylinder 12. A sealing member 19 that airtightly seals the outer cylinder 12 and the manifold 17 is provided between the outer-cylinder side flange 12$f$ and the manifold side flange 17$f$.

The manifold 17 has an annular support 20 on the upper inner wall thereof.

The support 20 protrudes inwards in the radial direction, and fixes and supports the lower end of the inner cylinder 11. A lid 21 is detachably mounted on a lower end opening 17$o$ of the manifold 17.

The lid 21 is a part of a substrate placement unit 22 by which a wafer boat 16 holding the substrates W is placed inside the processing container 10. The lid 21 is made of, for example, stainless steel, and has a disc shape. The lid 21 airtightly shields the lower end opening 17$o$ of the manifold 17 via a sealing member 18 formed on the lower end of the manifold 17 in a state where the substrates W are placed in the internal space IS.

A rotating shaft 24 that rotatably supports the wafer boat 16 via a magnetic fluid seal portion 23 passes through the central side of the lid 21. The lower portion of the rotating shaft 24 is supported by an arm 25A of an elevating mechanism 25 constituted by for example, a boat elevator. By raising and lowering the arm 25A of the elevating mechanism 25, the substrate processing apparatus 1 may vertically integrally move the lid 21 and the wafer boat 16 so as to insert and remove the wafer boat 16 into/from the processing container 10.

A rotating plate 26 is provided at the upper end of the rotating shaft 24. The wafer boat 16 that holds the substrates W is supported on the rotating plate 26 via a heat insulating unit 27. The wafer boat 16 is configured as a shelf where the substrates W may be held at predetermined intervals along the vertical direction. In a state where the substrates W are held by the wafer boat 16, the surfaces of the substrates W extend together in a horizontal direction.

A gas supply unit 30 is inserted into the processing container 10 via the manifold 17. The gas supply unit 30 introduces gases such as a processing gas, a purge gas, and a cleaning gas to the internal space IS of the inner cylinder 11. The gas supply unit 30 has the gas nozzle 31 that introduces, for example, a processing gas, a purge gas, and a cleaning gas. Only one gas nozzle 31 is illustrated in FIG. 1, but the gas supply unit 30 may include a plurality of gas nozzles 31. For example, in the gas supply unit 30, the gas nozzles 31 may be installed for the types of a processing gas, a purge gas, a cleaning gas, etc. respectively.

The gas nozzle 31 is an injector tube made of quartz, and extends along the vertical direction inside the inner cylinder 11 and then is bent in an L shape at its lower end. Then, the gas nozzle 31 is provided while penetrating the inside and outside of the manifold 17. Further, the gas nozzle 31 is fixed and supported to/by the manifold 17. The gas nozzle 31 has a plurality of gas holes 31$h$ at regular intervals along the vertical direction, and discharges gas in the horizontal direction through each of the gas holes 31$h$. The intervals of the gas holes 31$h$ are set to be the same as, for example, the intervals of the substrates W supported by the wafer boat 16. Further, the position of each gas hole 31$h$ in the vertical direction is set to be located in the middle between the substrates W adjacent to each other in the vertical direction. Therefore, each gas hole 31$h$ may allow gas to smoothly flow through a gap between the substrates W.

The gas supply unit 30 supplies, for example, a processing gas, a purge gas, and a cleaning gas to the gas nozzle 31 inside the processing container 10 while controlling the flow rate outside the processing container 10. An appropriate processing gas may be selected according to the type of the film to be formed on the substrate W. As an example, when a silicon oxide film is formed, for example, a silicon-containing gas such as dichlorosilane (DCS) gas, and an oxidizing gas such as ozone ($O_3$) gas may be used for the processing gas. For example, an inert gas such as nitrogen (N₂) gas, and argon (Ar) gas may be used for the purge gas.

A gas exhaust unit 40 exhausts the gas within the processing container 10, to the outside. The gas supplied by the gas supply unit 30 moves from the processing space of the inner cylinder 11 to the circulation space, and then is exhausted through a gas outlet 41. The gas outlet 41 is formed above the support 20 in the manifold 17. An exhaust passage 42 of the gas exhaust unit 40 is connected to the gas outlet 41. The gas exhaust unit 40 includes a pressure regulating valve 43 and a vacuum pump 44 in order from the upstream of the exhaust passage 42 to the downstream. The gas exhaust unit 40 adjusts the internal pressure of the processing container 10 by sucking the gas within the processing container 10 by the vacuum pump 44 and adjusting the flow rate of the exhaust gas by the pressure regulating valve 43.

The substrate processing apparatus 1 includes a plurality of types of temperature sensors 80 for detecting the temperature inside the temperature adjustment unit 50. The temperature sensor 80 according to the present exemplary embodiment includes an internal temperature sensor 81 that detects the temperature of the internal space IS of the processing container 10 (for example, the processing space of the inner cylinder 11), and an external temperature sensor 82 that detects the temperature outside the processing container 10.

The internal temperature sensor 81 has a plurality of (five in the present exemplary embodiment) thermometers 81a to 81e at different positions in the vertical direction. For example, a thermocouple, or a resistance temperature detector may be applied to the plurality of thermometers 81a to 81e. The thermometers 81a to 81e are arranged in zones to be described below respectively. The zones are set along the vertical direction of the processing container 10. Therefore, the internal temperature sensor 81 transmits the detected temperature of each zone to the controller 90 during the substrate processing.

Meanwhile, the temperature adjustment unit 50 is formed in a tubular shape that covers the entire processing container 10, and heats and cools each substrate W accommodated in the processing container 10. Specifically, the temperature adjustment unit 50 includes a cylindrical housing 51 having a ceiling, and a heater 52 provided inside the housing 51.

The housing 51 is formed larger than the processing container 10, and is provided at a position where the central axis thereof is substantially the same as the central axis of the processing container 10. For example, the housing 51 is attached to the top surface of a base plate 54 to which the outer-cylinder side flange 12f is fixed. The housing 51 is provided with a spacing from the outer peripheral surface of the processing container 10, so that a temperature control space 53 is formed between the outer peripheral surface of the processing container 10 and the inner peripheral surface of the housing 51. The temperature control space 53 is formed continuously from the lateral side and the top side of the processing container 10.

The housing 51 includes a heat insulating portion 51a that has a ceiling and covers the entire processing container 10, and a reinforcing portion 51b that reinforces the heat insulating portion 51a on the outer periphery side of the heat insulating portion 51a. That is, the side wall of the housing 51 takes a stacked structure of the heat insulating portion 51a and the reinforcing portion 51b. The heat insulating portion 51a is made of, for example, silica or alumina as a main component, and suppresses heat transfer within the heat insulating portion 51a. The reinforcing portion 51b is made of a metal such as stainless steel. Further, the outer periphery side of the reinforcing portion 51b is covered with a water cooling jacket (not illustrated) in order to suppress the thermal effect on the outside of the temperature adjustment unit 50.

The heater 52 of the temperature adjustment unit 50 is disposed on the lateral side of the processing container 10. As for this type of heater 52, an appropriate configuration capable of heating the plurality of substrates W accommodated within the processing container 10 may be adopted. For example, as for the heater 52, an infrared heater that heats the processing container 10 through radiation of infrared rays may be used. In this case, the heater 52 is linearly formed, and is held on the inner peripheral surface of the heat insulating portion 51a via a holding unit (not illustrated) in a spiral shape, an annular shape, an arcuate shape, or a shank shape or a meandering manner.

The heater 52 is divided into a plurality of (five in the present exemplary embodiment) heaters along the vertical direction of the temperature adjustment unit 50, and to each, a temperature control driver 55 is connected. Each temperature control driver 55 is connected to the controller 90, and supplies electric power adjusted under the control of the controller 90, to each heater 52 connected thereto so as to heat each heater 52. Therefore, the substrate processing apparatus 1 may independently adjust the temperatures of the processing container 10 in the zones where the heaters 52 are provided, respectively. Hereinafter, the zones set in the processing container 10 are also referred to as "TOP," "C-T," "CNT," "C-B," and "BTM" in order from the top.

The temperature adjustment unit 50 includes the temperature sensor 80 (the external temperature sensor 82) at a position near each heater 52. Like the internal temperature sensor 81, the external temperature sensor 82 has thermometers 82a to 82e corresponding to the zones, respectively, along the vertical direction, and transmits the detected temperature of each zone to the controller 90 during the substrate processing.

Furthermore, the temperature adjustment unit 50 includes an external circulation unit 60 that allows a cooling gas (air, inert gas) to flow through the temperature control space 53 in order to cool the processing container 10 during the substrate processing. Specifically, the external circulation unit 60 includes an external supply path 61 and a flow rate regulator 62 formed outside the temperature adjustment unit 50, a supply flow path 63 formed in the reinforcing portion 51b, and a supply hole 64 formed in the heat insulating portion 51a. Further, in the external supply path 61, a temperature adjuster (for example, a heat exchanger, or a radiator) may be provided in order to adjust the temperature of air flowing into the temperature control space 53.

The external supply path 61 is connected to a blower (not illustrated), and the blower supplies air toward the temperature adjustment unit 50. The external supply path 61 diverges into a plurality of branch paths 61a at a middle position thereof. The flow rate regulator 62 is provided for each of the branch paths 61a, and adjusts the flow rate of air flowing through each branch path 61a. The flow rate regulators 62 may change the flow rates of air independently of each other under the control of the controller 90. The supply flow paths 63 are formed at a plurality of places along the axial direction (vertical direction) of the reinforcing portion 51b, and annularly extend along the circumferential direction inside the cylindrical reinforcing portion 51b. Each supply hole 64 is formed through the heat insulating portion 51a and communicates with each supply flow path 63, so as to jet the air introduced into each supply flow path 63, toward the temperature control space 53.

The external circulation unit 60 includes an exhaust hole 65 in the ceiling of the housing 51. Through the exhaust hole 65, the air supplied into the temperature control space 53 is discharged. The exhaust hole 65 is connected to an external exhaust path 66 formed outside the housing 51. The external exhaust path 66 exhausts the air in the temperature control space 53 toward an appropriate waste portion. Alternatively, the external circulation unit 60 may have a configuration where the external exhaust path 66 is connected to the external supply path 61 so as to circulate the air used in the temperature control space 53.

To the controller 90 of the substrate processing apparatus 1, a computer having, for example, a processor 91, a memory 92, and an input/output interface (not illustrated) may be applied. The processor 91 has a combination of one or more of a central processing unit (CPU), a graphics processing unit (GPU), an application specific integrated circuit (ASIC), a field-programmable gate array (FPGA), and a circuit composed of a plurality of discrete semiconductors. The memory 92 has an appropriate combination of a volatile memory and a non-volatile memory (for example, a compact disc, a digital versatile disc (DVD), a hard disk, and a flash memory).

The memory 92 stores a program that operates the substrate processing apparatus 1 and recipes such as process conditions for substrate processing. The processor 91 reads and executes the program of the memory 92 so as to control each component of the substrate processing apparatus 1. The controller 90 may be configured by a host computer or a plurality of client computers which perform information communication via a network.

A user interface 95 is connected to the controller 90 via the input/output interface. Examples of the user interface 95 may include a touch panel (an input/output device), a display, a keyboard, a mouse, a speaker, and a microphone. The controller 90 receives the recipe of the substrate processing apparatus 1 input by the user via the user interface 95, and controls each component of the substrate processing apparatus 1 based on the recipe. When the controller 90 receives information from each component during, for example, the substrate processing, the substrate processing information (for example, a status, and an error) is appropriately notified via the user interface 95.

At the start of substrate processing of forming a desired film on the substrate W, the above substrate processing apparatus 1 repeats substrate processing based on temporary process conditions (hereinafter, also referred to as set-up substrate processing) a plurality of times so as to perform an operation of setting parameters of new process conditions (a parameter setting method). In particular, for the process conditions, it is necessary to adjust the temperature in the heater 52 in each of the zones (temperature tilt relative to a target temperature) in order to obtain inter-surface uniformity of making the film thicknesses of the substrates W uniform. Then, in a conventional parameter setting method, the set-up substrate processing and the measurement of the film thickness of each substrate W for each set-up substrate processing are repeated a plurality of times. This takes time.

Therefore, in the parameter setting method, the substrate processing apparatus 1 according to the present exemplary embodiment acquires reference information related to the film thickness and the temperature of the processing container 10, in advance, and uses the reference information to estimate the film thickness in the set-up substrate processing. Therefore, it becomes unnecessary to measure the film thickness of each substrate W for each set-up substrate processing, and the operation efficiency may be greatly improved. Hereinafter, the parameter setting method will be described in detail.

Figure 2A:
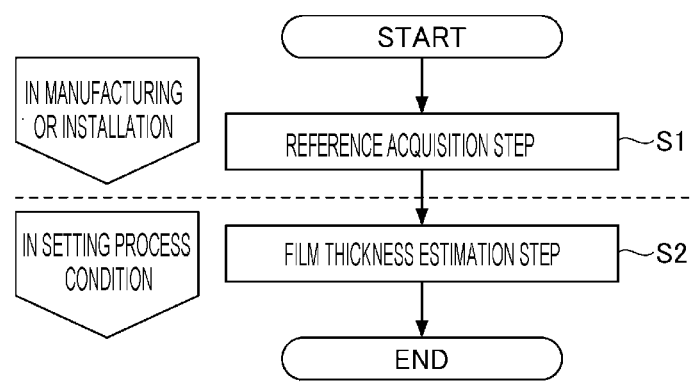
FIG. 2A is a flow chart illustrating the processing flow of a parameter setting method.

Specifically, as illustrated in FIG. 2A, the controller 90 of the substrate processing apparatus 1 performs, as a parameter setting method, a reference acquisition step (step S1), and a film thickness estimation step (step S2). The reference acquisition step is a step of acquiring reference information indicating the relationship between the thermal effect of the temperature control of the temperature adjustment unit 50, on the processing container 10 in each of the zones, and the film thickness of the film formed in the processing container 10 by substrate processing. This reference acquisition step is performed, for example, in manufacturing the substrate processing apparatus 1, setting up a factory to be used or performing maintenance (cleaning, and replacement of the processing container 10). Meanwhile, the film thickness estimation step is performed after set-up substrate processing at the time of setting new process conditions. In the film thickness estimation step, the film thickness is estimated based on the thermal effect information of the processing container 10 in which the film has been formed during the set-up substrate processing, and the reference information acquired in the reference acquisition step.

Figure 3:
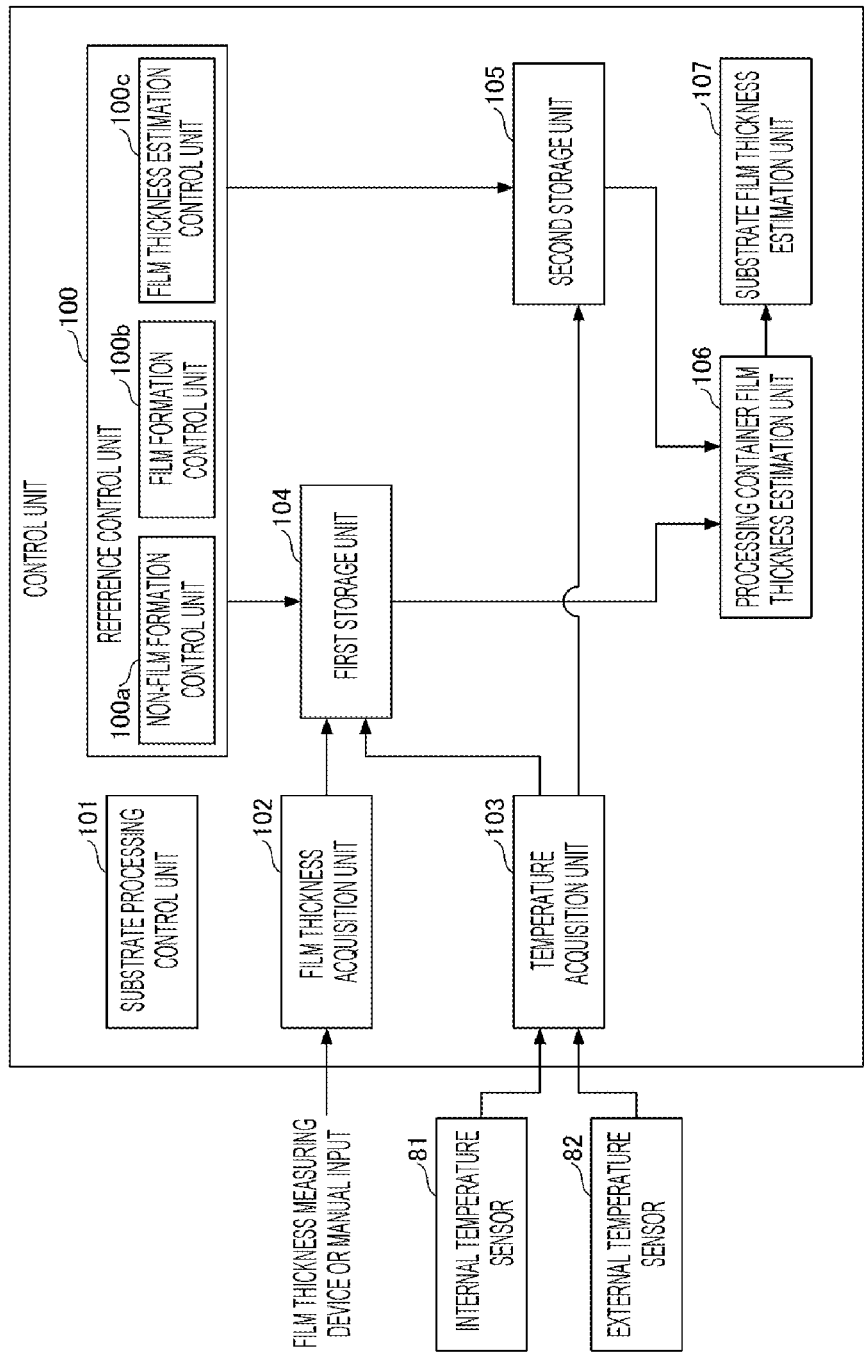
FIG. 3 is a block diagram illustrating functional blocks of a controller when parameters are set.

In order to perform the above parameter setting method, within the controller 90, functional blocks are constructed as illustrated in FIG. 3. Specifically, within the controller 90, a set-up operation control unit 100, a substrate processing control unit 101, a film thickness acquisition unit 102, a temperature acquisition unit 103, a first storage unit 104, a second storage unit 105, a processing container film thickness estimation unit 106 and a substrate film thickness estimation unit 107 are formed.

The set-up operation control unit 100 is a functional unit that controls the operation of each component (e.g., the heaters 52) of the substrate processing apparatus 1 in the reference acquisition step and the film thickness estimation step in order to obtain information necessary for film thickness estimation of the parameter setting method. Therefore, the set-up operation control unit 100 has a non-film formation control unit 100a and a film formation control unit 100b which perform the reference acquisition step, and also has a film thickness estimation control unit 100c that performs the film thickness estimation step.

Figure 2B:
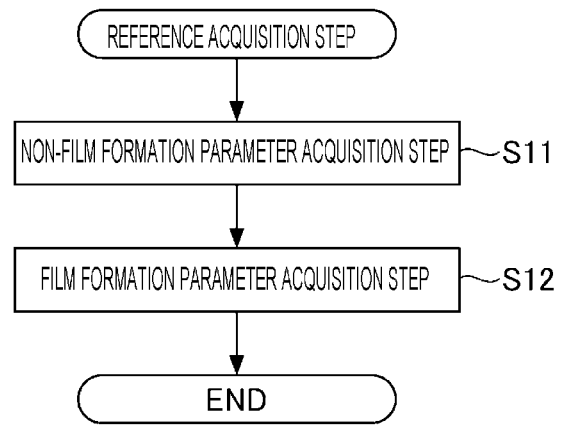
FIG. 2B is a flow chart illustrating the processing flow of a reference acquisition step.

Specifically, as illustrated in FIG. 2B, in the reference acquisition step, a non-film formation parameter acquisition step (step S11) and a film formation parameter acquisition step (step S12) are sequentially performed.

Figure 4A:
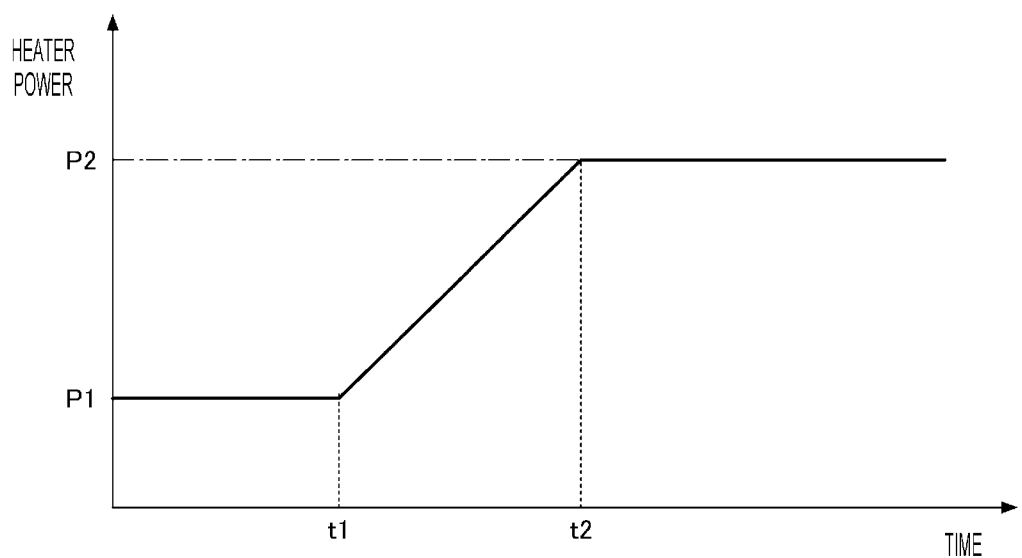
FIG. 4A is a graph illustrating a heater power pattern in the parameter setting method.

The non-film formation parameter acquisition step is a step of acquiring an index (first index) of the thermal effect in the processing container 10 when the processing container 10 is heated, in a state where no substrate processing has been performed (no film is formed on the inner surface of the processing container 10). In the non-film formation parameter acquisition step, the non-film formation control unit 100a supplies electric power (heater power) in an optional pattern to each of the heaters 52 of the zones so as to heat the heater 52 of each zone. The values of heater power to be supplied to the respective heaters 52 of the zones may be the same or may be different from each other according to, for example, the specifications of the substrate processing apparatus 1. For example, as illustrated in FIG. 4A, the heater power is set as first power P1 (or power zero) that is stable in a low state, until a time point t1. Then, the pattern of the heater power is set such that the electric power is gradually increased every unit time from the time point t1 to a time point t2, and is shifted to second power P2(>P1) that is stable in a high state, at the time point t2.

In the non-film formation parameter acquisition step, the non-film formation control unit 100a stops the flowing (supply, discharge) of the gas in the processing container 10 so that only the thermal effect of the heater 52 of each zone is applied to the processing container 10. The non-film formation control unit 100a may be configured to supply an inert gas by the gas supply unit 30 and to exhaust the gas of the processing container 10 by the gas exhaust unit 40 so that the internal pressure of the processing container 10 is maintained at a constant pressure.

Then, during the non-film formation parameter acquisition step, the temperature acquisition unit 103 of the controller 90 (see FIG. 3) detects the temperature of each zone of the processing container 10 by the internal temperature sensor 81, and stores the detected temperature of each zone, in the first storage unit 104. Here, when the heater power is changed, the temperature acquisition unit 103 calculates a temperature change amount of the internal temperature sensor 81 (a difference between the internal temperature and the starting temperature), from the temperature at the heater power that is the first power P1 (starting temperature: e.g., 400° C.). Then, the temperature acquisition unit 103 stores the temperature change amount in the first storage unit 104, in association with the time information of the time calculated in the controller 90. Hereinafter, the temperature change amount of each zone acquired in the non-film formation parameter acquisition step is referred to as non-film formation temperature change information ΔTic.

In the non-film formation parameter acquisition step, the temperature acquisition unit 103 may detect the temperature of each zone outside the processing container 10 (the external temperature) by the external temperature sensor 82. The external temperature of each zone is also affected by a temperature change when a film is present in the processing container 10 and when a film is not present, and thus may be used for film thickness estimation. When the external temperature is used, the controller 90 may store the external temperature in each zone, in the first storage unit 104, in association with the non-film formation temperature change information ΔTic of the internal temperature sensor 81.

Through the above process, the controller 90 may satisfactorily recognize the thermal effect of heating of the heater 52 of each zone, on the processing container 10 (the non-film formation temperature change information ΔTic), in the processing container 10 in which no film is formed. In the non-film formation parameter acquisition step, the substrate processing apparatus 1 may perform processing in a state where the internal space IS is empty or in a state where a plurality of dummy substrates is set in the same manner as in the actual substrate processing.

Next, as illustrated in FIGS. 2A and 2B, and FIG. 3, the film formation parameter acquisition step is a step of acquiring an index (second index) of the thermal effect of the heater 52, and film thickness information of the processing container 10, in a case where a film is present on the inner surface of the processing container 10. Therefore, in the film formation parameter acquisition step, first, under the control of the substrate processing control unit 101, reference substrate processing of forming a film on the inner surface of the processing container 10 is performed. The substrate processing control unit 101 discharges the gas of the processing container 10 by the gas exhaust unit 40 while supplying the processing gas into the processing container 10 based on, for example, the recipe of the reference substrate processing so that a constant internal pressure of the processing container 10 is maintained. Further, the substrate processing control unit 101 heats the processing container 10 while controlling the heating of the heater 52 of each zone such that the target temperature of the reference substrate processing is reached. Thus, on the inner surface of the processing container 10, a film corresponding to the processing gas is formed during the reference substrate processing. As portions in the processing container 10 where films are formed, the inner peripheral surface and the outer peripheral surface of the inner cylinder 11, and the inner peripheral surface of the outer cylinder 12 may be exemplified.

After the reference substrate processing, the controller 90 temporarily cools the processing container 10. Then, in the film formation parameter acquisition step, the film thickness of the film formed on the inner surface of the processing container 10 is measured.

Various methods may be employed as a method of measuring the film thickness of the film formed on the inner surface of the processing container 10. For example, in the reference acquisition step, for example, a measuring rod (not illustrated) extending over each zone in the vertical direction is previously installed on, for example, the inner peripheral surface of the inner cylinder 11, and then after the reference substrate processing, the measuring rod is taken out. Then, the film thickness of each zone may be acquired by measuring the film thickness of the film formed on the measuring rod with a film thickness measuring device (not illustrated). Further, for example, the substrate processing apparatus 1 may have a configuration in which after the reference substrate processing, a film thickness measuring device (not illustrated) enters into the processing container 10 (the inner cylinder 11), and directly measures the film thickness of the film formed on the inner peripheral surface of the inner cylinder 11. Alternatively, the substrate processing apparatus 1 may have a configuration where after the reference substrate processing, the processing container 10 is disassembled, and the film thickness of each zone is measured in the disassembled inner cylinder 11 or the outer cylinder 12.

The film thickness acquisition unit 102 of the controller 90 acquires the film thickness of each zone measured as described above, as data based on the input of a user or the transmission from the film thickness measuring device, and stores the data in the first storage unit 104. Hereinafter, the film thickness information of each zone acquired in the film formation parameter acquisition step is referred to as a film thickness hif for film formation.

Then, in the film formation parameter acquisition step, the controller 90 operates the film formation control unit 100b in order to acquire the parameters of the thermal effect in the processing container 10 and the film thickness in a state where the film is formed on the processing container 10. The film formation control unit 100b supplies heater power in the same pattern as in the non-film formation parameter acquisition step, to the heater 52 of each zone of the temperature adjustment unit 50, so as to heat the heater 52 of each zone. Further, in the film formation parameter acquisition step, the film formation control unit 100b stops the flowing (supply, discharge) of the gas in the processing container 10 so that only the thermal effect of the heater 52 of each zone is applied to the processing container 10. When a gas has flowed in the processing container 10 in the non-film formation parameter acquisition step, a configuration may be employed in which an inert gas is supplied by the gas supply unit 30, and the gas of the processing container 10 is exhausted by the gas exhaust unit 40 so that the internal pressure of the processing container 10 is maintained at a constant pressure.

During the film formation parameter acquisition step, the temperature acquisition unit 103 of the controller 90 detects the temperature of each zone of the processing container 10 by the internal temperature sensor 81, and stores the detected temperature of each zone, in the first storage unit 104. Here, in the same manner as in the non-film formation parameter acquisition step, the temperature acquisition unit 103 calculates a temperature change amount of the internal temperature sensor 81 from the temperature (starting temperature) at the time point t1, as the reference, and stores the temperature change amount in the first storage unit 104 in association with time information of time calculated in the controller 90. Hereinafter, the temperature change amount of each zone acquired in the film formation parameter acquisition step is referred to as film formation temperature change information $\Delta Tif$.

In the film formation parameter acquisition step as well, the temperature acquisition unit 103 may detect the external temperature of each zone of the processing container 10 by the external temperature sensor 82, and then may store the external temperature in the first storage unit 104, in association with the film formation temperature change information $\Delta Tif$. In particular, as compared to in a case where no film is present on the inner surface of the processing container 10, when the film is formed on the inner surface of the processing container 10, it may be said that the temperature control space 53 is easily warmed, and the external temperature is easily increased. Thus, for example, the controller 90 may correct the non-film formation temperature change information $\Delta Tic$ and the film formation temperature change information $\Delta Tif$ by using the change amount of the external temperature in each zone in the non-film formation parameter acquisition step, and the change amount of the external temperature in each zone in the film formation parameter acquisition step.

Figure 4B:
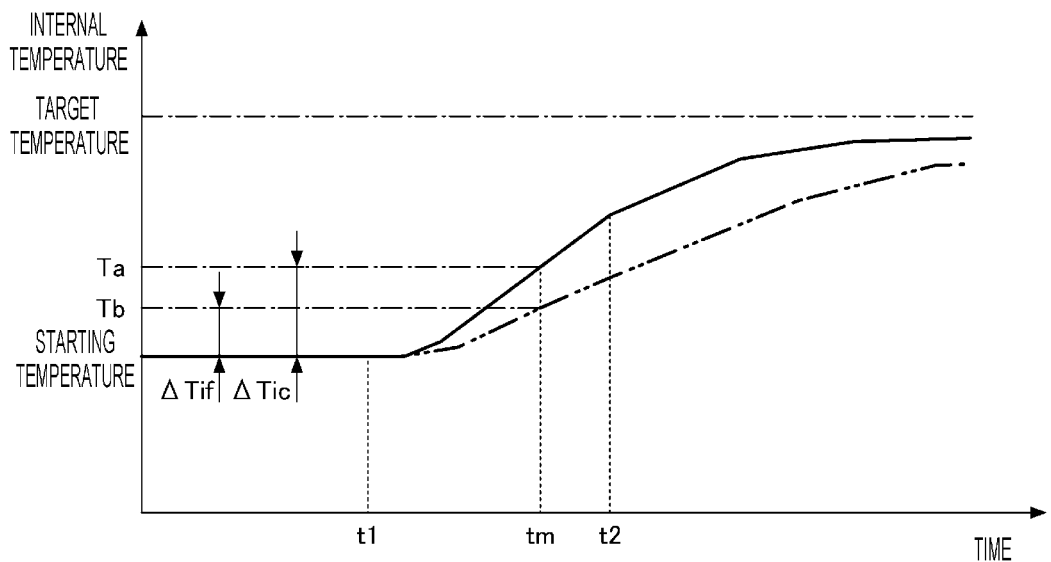
FIG. 4B is a graph illustrating a temperature change of a processing container in a state where no film is present and a temperature change of the processing container in a state where a film is present.

FIG. 4B is a graph illustrating a change with the lapse of time in the non-film formation temperature change information $\Delta Tic$ obtained by the non-film formation parameter acquisition step and the film formation temperature change information $\Delta Tif$ obtained by the film formation parameter acquisition step. As may be seen from this graph, in the non-film formation temperature change information $\Delta Tic$ and the film formation temperature change information $\Delta Tif$, the temperature rises between the time point t1 and the time point t2 in which the heater power rises, while interlocking with the heater power. Meanwhile, the temperature rise rate of the film formation temperature change information $\Delta Tif$ is suppressed to be lower than the temperature rise rate of the non-film formation temperature change information $\Delta Tic$.

This is because in the film formation parameter acquisition step, since the film is formed on the surface of, for example, the inner cylinder 11 or the outer cylinder 12 of the processing container 10, it becomes difficult for the radiant heat of the external heater 52 to reach the inside of the processing container 10. That is, when the heater power is increased from the thermally stable state, it may be said that in the processing container 10, the response of a temperature rise of the internal space IS becomes smaller according to the film thickness of the formed film. Therefore, in the temperature transition period between the time point t1 and the time point t2, the temperature value Tb of the film formation temperature change information $\Delta Tif$ is lower than the temperature value Ta of the non-film formation temperature change information $\Delta Tic$.

Referring back to FIG. 3, the film thickness estimation control unit 100c is a functional unit of controlling the operation of the substrate processing apparatus 1 in the film thickness estimation step after the reference acquisition step. For example, after set-up substrate processing is performed to set process conditions, the controller 90 operates the film thickness estimation control unit 100c. In the set-up substrate processing, the substrate processing control unit 101 performs the set-up substrate processing by controlling each component of the substrate processing apparatus 1 based on temporary process conditions set by the user. Accordingly, the film based on the set-up substrate processing is formed on the inner surface of the processing container 10 (the inner peripheral surface, and the outer peripheral surface of the inner cylinder 11, and the inner peripheral surface of the outer cylinder 12).

After the set-up substrate processing, the film thickness estimation control unit 100c supplies heater power having a pattern that is illustrated in FIG. 4A and is the same as that in the non-film formation parameter acquisition step, again, so as to heat the heater 52 of each zone. Further, in the film thickness estimation step, the film thickness estimation control unit 100c stops the flowing (supply, discharge) of the gas in the processing container 10 so that only the thermal effect of the heater 52 of each zone is applied to the processing container 10. When a gas has flowed in the processing container 10 in the reference acquisition step, a configuration may be employed in which an inert gas is supplied by the gas supply unit 30 and the gas of the processing container 10 is exhausted by the gas exhaust unit 40 so that the internal pressure of the processing container 10 is maintained at a constant pressure.

Then, in the film thickness estimation step as well, the temperature acquisition unit 103 of the controller 90 detects an index (third index) of the thermal effect in each zone of the processing container 10 by the internal temperature sensor 81, and stores the detected temperature of each zone, in the second storage unit 105. Hereinafter, the index of the thermal effect in each zone, which is acquired in the film thickness estimation step, will be referred to as estimation-related temperature change information $\Delta Tix$. As the estimation-related temperature change information $\Delta Tix$, a temperature change amount of the internal temperature sensor 81 from the temperature (starting temperature), as the reference, at the time point t1 prior to the rise of heater power, is calculated, and is stored in association with time information of time calculated in the controller 90.

In the film thickness estimation step as well, the temperature acquisition unit 103 may detect the external temperature of each zone of the processing container 10 by the external temperature sensor 82, and then may store the external temperature in the second storage unit 105 in association with the estimation-related temperature change information $\Delta Tix$. Thus, like in the non-film formation parameter acquisition step, the controller 90 may correct the internal temperature (the estimation-related temperature change information $\Delta Tix$) by the external temperature of each zone.

In the film thickness estimation step, the processing container film thickness estimation unit 106 estimates the film thickness of the film formed on the processing container 10 by using the temperature change information $\Delta Tix$ when a desired measurement timing (tm) has elapsed from the start (the time point t1) of application of the heater power pattern. The measurement timing (tm) may be set based on the timing (the elapsed time from the time point t1) at which a sufficient difference occurs between the non-film formation temperature change information $\Delta Tic$, and the film formation temperature change information $\Delta Tif$ acquired in the reference acquisition step.

Then, the processing container film thickness estimation unit 106 calculates the film thickness hiy of the film formed in each of the zones of the processing container 10 by the following equation (1).

$$hiy = (\Delta Tix - \Delta Tic)/(\Delta Tif - \Delta Tic) \times hif \quad (1)$$

ΔTic: non-film formation temperature change information
ΔTif: film formation temperature change information
hif: film thickness for formed film
ΔTix: estimation-related temperature change information That is, (ΔTix−ΔTic)/(ΔTif−ΔTic) in the above equation (1) is a proportional coefficient indicating the ratio of the thermal effect caused by the film formed on the processing container 10 during the reference acquisition step, to the thermal effect caused by the film formed on the processing container 10 during the film thickness estimation step. Thus, it may be said that the film thickness hiy of each zone in the film thickness estimation step, which is calculated by the equation (1), indicates a value obtained by highly accurately estimating the thickness of the film formed in each zone of the inner surface of the processing container 10 during the set-up substrate processing.

The substrate film thickness estimation unit 107 estimates the film thickness of the film formed on the substrate W in each zone, based on the film thickness in each zone on the inner surface of the processing container 10, the film thickness having been estimated in the film thickness estimation step. That is, the film thicknesses of the films formed on the inner surface of the processing container 10 and on the substrate W, respectively, through the set-up substrate processing are correlated. For this reason, for example, the substrate film thickness estimation unit 107 performs, for example, experiments or simulations in advance, and then holds map information or a function (not illustrated) of a film thickness model indicating the relationship between the film thickness of the processing container 10 and the film thickness of the substrate W. Then, upon receiving the film thickness of each zone of the processing container 10, which is estimated by the processing container film thickness estimation unit 106, the substrate film thickness estimation unit 107 extracts the film thickness of the substrate W in each zone with reference to the film thickness model.

Here, in the conventional substrate processing apparatus, in a case where the set-up substrate processing is performed to acquire the film thickness of the substrate W of each zone, a monitoring target substrate W is placed in each set zone in advance, and after the substrate processing, the film thickness of each monitoring target substrate W is measured. Therefore, there is a problem in that it takes time to cool the monitoring target substrate W, to transport the substrate W, or to measure the film thickness. In particular, when set-up substrate processing is repeated a plurality of times in order to obtain the inter-surface uniformity, a long time is required until the start of substrate processing. On the other hand, the substrate processing apparatus 1 according to the present exemplary embodiment may efficiently estimate the film thickness of each substrate W by performing the film thickness estimation step along with the set-up substrate processing.

The controller 90 may be configured to calculate the film thickness in each zone of the processing container 10 or the film thickness of the substrate W in each zone, and then to notify the user of this information via the user interface 95.

Alternatively, the controller 90 may calculate the temperature adjustment information for the heater 52 of each zone, by which film thicknesses of the substrates W are made uniform, based on the estimated film thickness of each zone of the processing container 10 (or the film thickness of the substrate W in each zone). For example, the controller 90 may input the calculated film thickness deviation amount of each zone, and calculate the temperature tilt for each of the zones such that a target film thickness set by the recipe is reached. The temperature tilt is temperature adjustment information that causes a shift (increase or decrease) in the target temperature of each zone as a whole. As an example, for a shift in a direction in which the film thickness of the substrate W in the TOP zone is increased, a temperature rise amount is calculated for the temperature in the TOP zone based on the film thickness deviation amount and the target film thickness in the TOP zone, and the temperature rise amount is set as the temperature tilt. Thus, the user may easily set the target temperature of each zone (in consideration of inter-surface uniformity), by which film thicknesses of the substrates W are made uniform in the substrate processing.

Further, the substrate processing apparatus 1 may be configured to change the flow rate of the processing gas to be supplied to the substrates W in each of the zones based on the estimated film thickness in each zone of the processing container 10 (or the film thickness of the substrate W in each zone). For example, the gas supply unit 30 has the gas nozzles 31 which independently supply the processing gas to the zones, respectively, and includes a flow rate regulator (not illustrated) capable of adjusting the flow rate of the processing gas in the gas path connected to each of the gas nozzles 31. Then, the controller 90 calculates target flow rate information for each of the zones according to the calculated film thickness deviation amount and the target film thickness in each zone. As an example, for a shift in a direction in which the film thickness of the substrate W in the TOP zone is increased, the target flow rate is increased based on the film thickness deviation amount and the target film thickness of the TOP zone. Therefore, the substrate processing apparatus 1 may also adjust the flow rate of the processing gas in the substrate processing so as to make the film thicknesses of the substrates W uniform. Of course, the substrate processing apparatus 1 may adjust both the temperature adjustment information and the processing gas flow rate information based on the calculated film thickness in each zone.

The substrate processing apparatus 1 according to the present exemplary embodiment is basically configured as described above, and its operation (parameter setting method) will be described below.

In the parameter setting method, as illustrated in FIG. 2A and FIG. 2B, the controller 90 performs a reference acquisition step (step S1), and a film thickness estimation step (step S2). Then, in the reference acquisition step, the set-up operation control unit 100 performs a non-film formation parameter acquisition step (step S11) by the non-film formation control unit 100a, and then performs a film formation parameter acquisition step (step S12) by the film formation control unit 100b. Accordingly, the controller 90 may obtain non-film formation temperature change information ΔTic, film formation temperature change information ΔTif, and a film thickness hif for film formation, as each zone reference information to be used in the film thickness estimation step.

Figure 5:
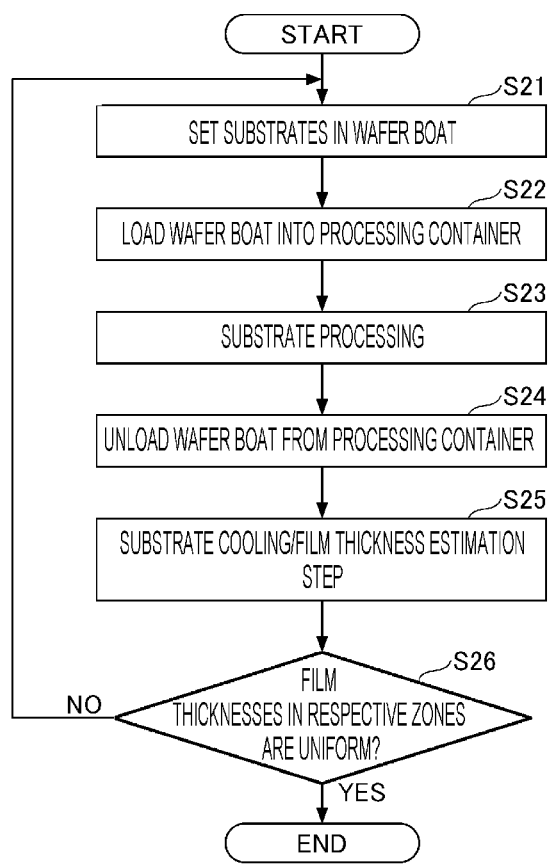
FIG. 5 is a flow chart illustrating a processing flow including a set-up substrate processing and a film thickness estimation step.

Then, in starting process conditions for new substrate processing, as illustrated in FIG. 5, the controller 90 performs a processing flow including a set-up substrate processing and a film thickness estimation step. Specifically, first, the substrate processing control unit 101 of the controller 90 sets a plurality of substrates W in the wafer boat 16 (see FIG. 1) (step S21).

Next, the substrate processing control unit 101 raises the wafer boat 16 and loads the wafer boat 16 into the processing container 10 so as to place the substrates W in the internal space IS (step S22).

Then, the substrate processing control unit 101 performs substrate processing of each substrate W based on temporary process conditions specified by the user (step S23). Accordingly, a film corresponding to a processing gas is formed on each substrate W and a film corresponding to the processing gas is also formed on the inner surface of the processing container 10.

After the substrate processing is ended, the substrate processing control unit 101 lowers the wafer boat 16 and unloads the wafer boat 16 from the inside of the processing container 10 (step S24).

Next, while each substrate W taken out of the processing container 10 is cooled, the film thickness estimation step of estimating the film thickness of the processing container 10 is performed by the film thickness estimation control unit 100c (step S25). Here, the film thickness estimation control unit 100c supplies electric power to the heater 52 of each zone in the same pattern as that of heater power in the reference acquisition step, so that the processing container 10 is heated by the heater 52 of each zone. During heating of the processing container 10, the lower end opening of the processing container 10 is closed with the lid 21. Then, the temperature acquisition unit 103 detects the temperature of each zone of the processing container 10 by the internal temperature sensor 81 to acquire estimation-related temperature change information $\Delta Tix$. Since the estimation-related temperature change information $\Delta Tix$ may be information at the measurement timing (tm), the film thickness estimation control unit 100c may stop heating of the processing container 10 immediately after the measurement timing (tm) has elapsed.

Next, the processing container film thickness estimation unit 106 estimates the film thickness of the film formed on the inner surface of the processing container 10 through the above equation (1) by using the acquired estimation-related temperature change information $\Delta Tix$ and the previously acquired reference information. As a result, in each zone of the processing container 10, the thickness of the film associated with the set-up substrate processing is highly accurately estimated. Further, the substrate film thickness estimation unit 107 estimates the film thickness of the substrate W of each zone based on the estimated film thickness in each zone of the processing container 10.

After the above film thickness estimation, the controller 90 determines whether estimated film thicknesses of the substrates W of each zone are uniform (step S26). When the film thicknesses of the substrates W in each zone are significantly different from each other (step S26: NO), the inter-surface uniformity is not obtained. Thus, the controller 90 notifies the user of the information (the film thicknesses of the substrates W in each zone), and urges the user to change temporary process conditions. Then, after the user changes the temporary process conditions, the process returns to step S21, and the same processing flow (the set-up substrate processing, and the film thickness estimation step) is repeated again.

Meanwhile, when the film thicknesses of the substrates W of each zone are uniform (step S26: YES), the inter-surface uniformity may be obtained. Therefore, the controller 90 notifies the user of information indicating that there is inter-surface uniformity, and ends this setting of parameters of process conditions.

As described above, in the parameter setting method and the substrate processing apparatus 1 according to the present exemplary embodiment, by acquiring reference information, it is possible to efficiently estimate the film thickness on the inner surface of the processing container 10 or the film thickness of each substrate W in the set-up substrate processing. Therefore, even if the set-up substrate processing is repeated a plurality of times in order to set parameters of process conditions, it is possible to greatly reduce the time required for the operation.

The parameter setting method and the substrate processing apparatus 1 according to the present disclosure are not limited to the above exemplary embodiment, and may take various modifications. For example, the parameter setting method is not limited to the use of temperature change information $\Delta Tic$, $\Delta Tif$, and $\Delta Tix$ at one measurement timing (tm), between the time points t1 to t2 in which the heater power is changed, and temperature change information at a plurality of time points (measurement timings tm) may be used. As a result, for example, a plurality of film thicknesses in the same zone is calculated and the average value may be obtained. Then, it is possible to reduce, for example, an error (noise) in the estimated film thickness.

When the external temperature of the external temperature sensor 82 is used, the controller 90 may monitor the suitability of temperature control of the heater 52. For example, when the external temperature is included in the allowable range of the target temperature of the heater 52, the controller 90 determines that the internal temperature at that time may be used. Meanwhile, when the external temperature is outside the allowable range of the target temperature of the heater 52, the controller 90 determines that the internal temperature at that time is not able to be used. This is because when the external temperature is outside the allowable range, the temperature of the heater 52 does not follow the target temperature, and thus there is a possibility that an accurate value may not be obtained even if the internal temperature is used. The processing container film thickness estimation unit 106 may extract the point in time, at the timing at which the internal temperature may be used, and apply the point in time as a measurement timing (tm) in the subsequent film thickness estimation step, so that the temperature change information in the film thickness estimation step may be highly accurately obtained.

The controller 90 is not limited to estimating the film thickness based on temperature change information when the measurement timing (tm) is reached, and may use the time at which the temperature of the processing container 10 has reached a desired measurement temperature (for example, the temperature value Ta in FIG. 4B). The controller 90 may also satisfactorily estimate the film thickness on the inner surface of the processing container 10 in the same manner as described above, by using the first time at which the measurement temperature is reached in a state where no film is present on the inner surface of the processing container 10, and the second time at which the measurement temperature is reached in a state where a film is present on the inner surface of the processing container 10.

Further, depending on the types of films to be formed, there is a possibility that the relationship between the film thickness of the film formed on the inner surface of the processing container 10 and the temperature change of the processing container 10 may be nonlinear. In this case, in the parameter setting method, a plurality of reference substrate processes may be performed in the reference acquisition step, so as to acquire a plurality of film thicknesses hif for film formation in the processing container 10 and to acquire a plurality of temperature change information pieces ΔTif. Then, the controller 90 may previously calculate the function (curve) indicating the relationship between the acquired film thicknesses hif for film formation and the temperature change information pieces ΔTif, so that the temperature change information ΔTix acquired in the film thickness estimation step may be used for this function to highly accurately estimate the film thickness. Alternatively, the function may also be obtained by using information on the film thickness and the temperature change calculated by, for example, optical simulations. That is, it may be said that the function (the shape of the curve) is the same between the reference acquisition step and the film thickness estimation step if the configuration of the substrate processing apparatus 1 is the same, and the type of the processing gas is the same. For this reason, by calculating the function under representative conditions, it is possible to satisfactorily use reference information in starting a plurality of new processes.

Figure 6:
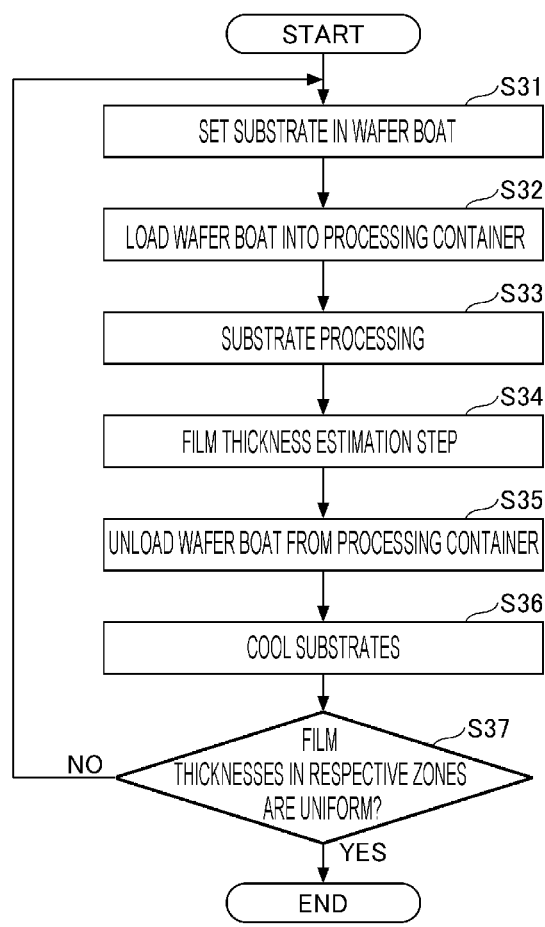
FIG. 6 is a flow chart according to a first modification, which illustrates a processing flow including a set-up substrate processing and a film thickness estimation step.

Further, as in the configuration of the first modification illustrated in FIG. 6, the film thickness estimation step of the parameter setting method may be performed immediately after the set-up substrate processing. Specifically, in the processing flow of FIG. 6, the processing performed in step S31 to step S33, is the same as that in step S21 to step S23 of FIG. 5.

Then, after step S33, in the parameter setting method, in a state where the substrates W are accommodated inside the processing container 10, the film thickness estimation step is performed (step S34). In the film thickness estimation step, the film thickness estimation control unit 100c heats the heater 52 of each zone in the same pattern as that of heater power in the reference acquisition step, so that the estimation-related temperature change information ΔTix of each zone of the processing container 10 is acquired by the temperature acquisition unit 103. Then, the controller 90 estimates the film thickness of the film formed on the inner surface of the processing container 10 by the processing container film thickness estimation unit 106 and estimates the film thickness on the substrate W in each zone by the substrate film thickness estimation unit 107.

After the film thickness estimation step, the substrate processing control unit 101 lowers the wafer boat 16 and unloads the wafer boat 16 from the inside of the processing container 10 (step S35), and then cools each substrate W taken out of the processing container 10 (step S36).

Further, the controller 90 determines whether the film thicknesses of the substrates W in each zone, which are estimated in the film thickness estimation step, are uniform (step S37). Then, when the film thicknesses of the substrates W in each zone are significantly different from each other (step S37: NO), the user changes temporary process conditions, and then, the process returns to step S31, and the same processing flow is repeated again. Meanwhile, when the film thicknesses of the substrates W of each zone are uniform (step S37: YES), the user is notified of information indicating that there is inter-surface uniformity, and this setting of parameters of process conditions is ended.

In this manner, in the parameter setting method, by performing the film thickness estimation step immediately after the substrate processing, it is also possible to estimate the film thickness on the inner surface of the processing container 10 or the film thickness of each substrate W. In particular, in the first modification, since it is not necessary to perform, for example, an operation of taking out the wafer boat 16 and then closing the processing container 10, it is possible to obtain an advantage in that the configuration of the substrate processing apparatus 1 may be simplified.

Figure 7A:
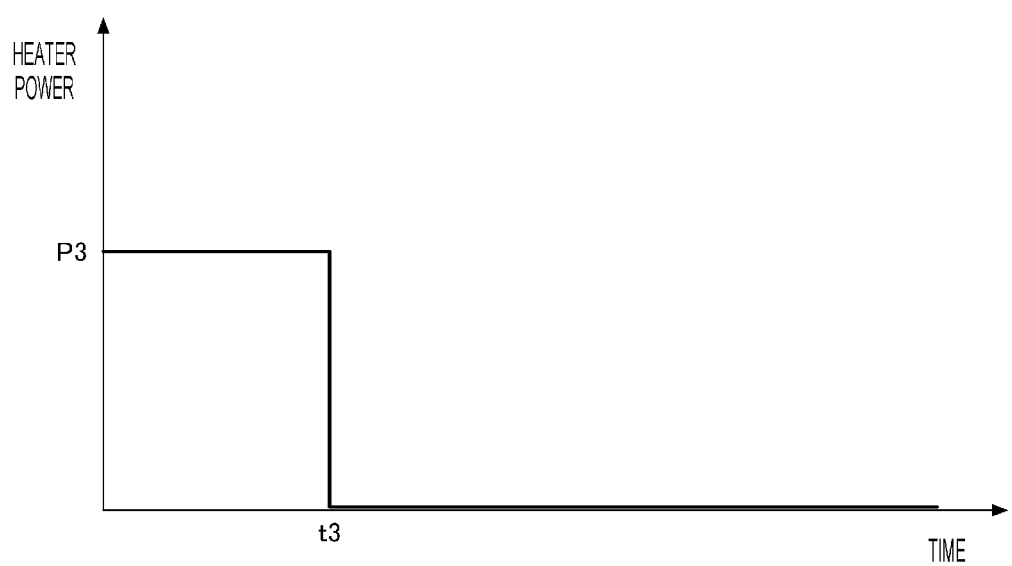
FIG. 7A is a graph illustrating a heater power pattern in a parameter setting method according to a second modification.
Figure 7B:
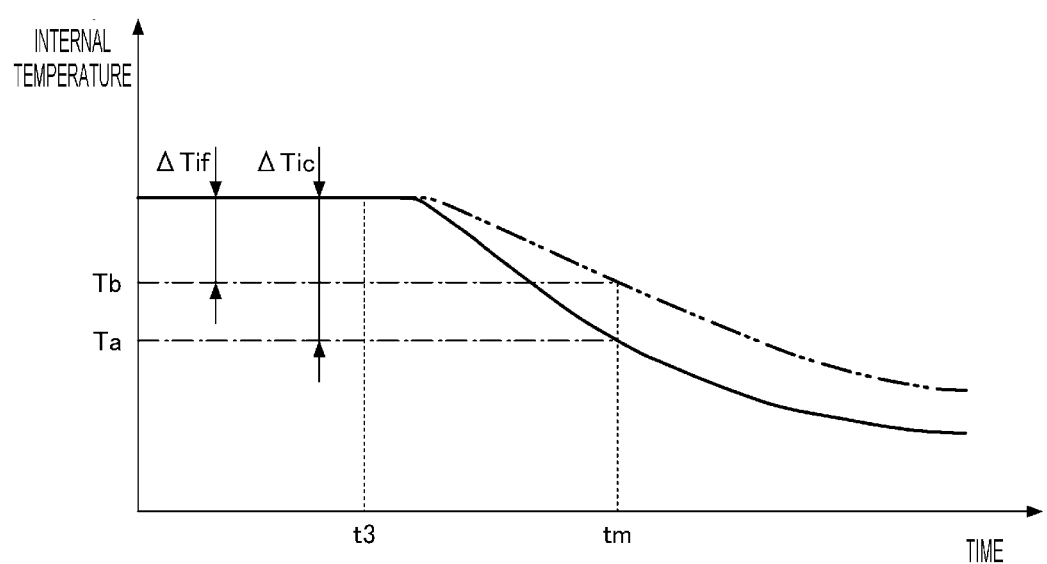
FIG. 7B is a graph illustrating a temperature change of a processing container in a state where no film is formed, and a temperature change of the processing container in a state where a film is formed, in the second modification.

In the parameter setting method, as in the second modification illustrated in FIGS. 7A and 7B, temperature change information ΔTic, ΔTif, and ΔTix of the processing container 10 after a time point t3 at which the heater power is turned OFF (fourth power=zero) from the ON state (third power P3) may be used. The heater power is not limited to switching from ON to OFF, and may have a transitional period pattern in which the third power in a stable state is switched to the fourth power lower than the third power.

In this case as well, heat dissipation is likely to proceed in a state where no film is present on the inner surface of the processing container 10 whereas heat dissipation is unlikely to proceed in a state where a film is present on the inner surface of the processing container 10. Therefore, the temperature decrease rate in a state where a film is present on the inner surface of the processing container 10 is smaller than the temperature decrease rate in a state where no film is present on the inner surface of the processing container 10. By using a difference in the temperature decrease rate, the controller 90 may also satisfactorily obtain reference information for estimating the film thickness on the inner surface of the processing container 10. Then, in the film thickness estimation step as well, by extracting the temperature when the heater power is switched from the third power to the fourth power, it is possible to easily obtain the film thickness on the inner surface of the processing container 10 or the film thickness of each substrate W based on the previously acquired reference information.

Figure 8:
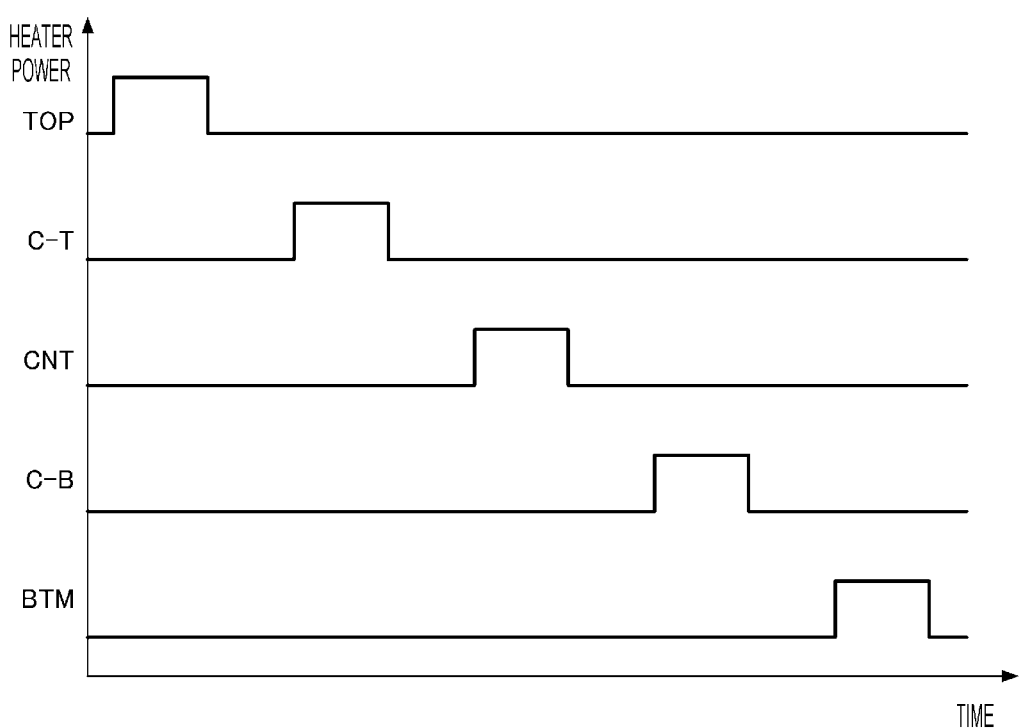
FIG. 8 is a graph illustrating operation timings of zones in a third modification.

Further, as in the third modification illustrated in FIG. 8, in the parameter setting method, in the reference acquisition step and the film thickness estimation step, the respective heaters 52 of the zones TOP, C-T, CNT, C-B, and BTM may be operated at different operation timings to heat the processing container 10. When the respective heaters 52 of the zones are operated separately in this manner, the thermal effect information and the film thickness of the processing container 10 are acquired for each zone in which the operation has been performed, and thus the influence of the heat of another zone is not applied. Therefore, in the parameter setting method, it is possible to more accurately obtain temperature change information of the processing container 10, which is caused by the thermal effect in the desired zone, so that the accuracy of film thickness estimation may be further increased.

Figure 9A:
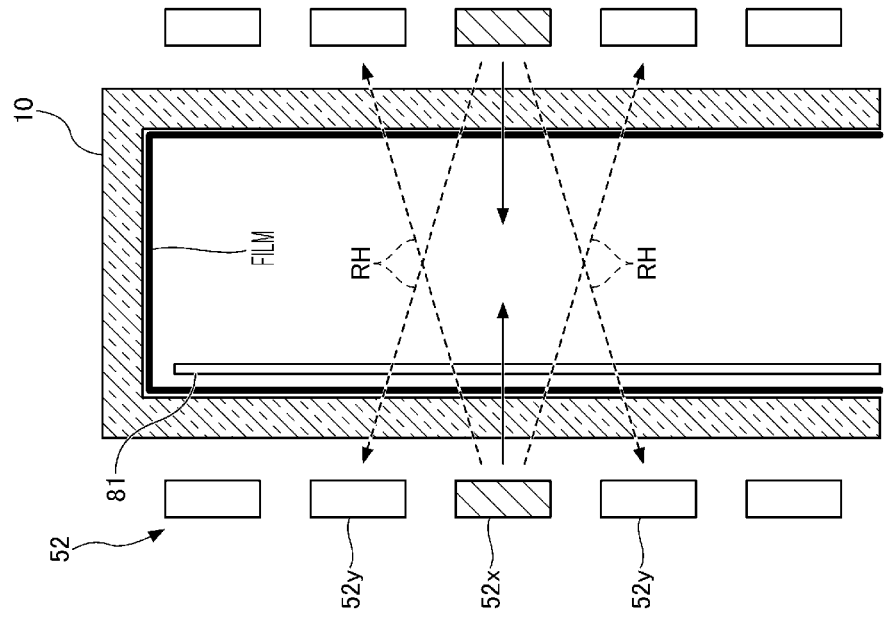
FIG. 9A is an explanatory view illustrating a measurement example of a resistance value of a heater in a state where no film is present, in a fourth modification.
Figure 9B:
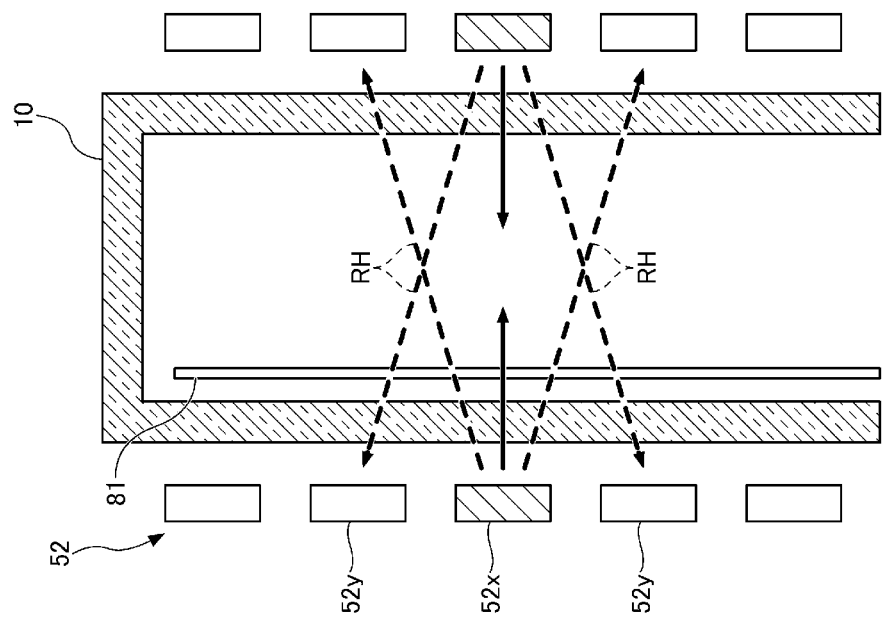
FIG. 9B is an explanatory view illustrating a measurement example of a resistance value of a heater in a state where a film is present, in the fourth modification.

Further, as in the fourth modification illustrated in FIGS. 9A and 9B, in the parameter setting method, when any zone (the CNT zone in FIGS. 9A and 9B) is heated, a change in the resistance value of another zone may be detected as an index of the thermal effect of the processing container 10. That is, when the heater 52x in any zone is heated, the radiant heat RH of the heater 52x is also transferred to the heaters 52y of other zones (for example, adjacent zones). The heaters 52y in other zones are supplied with bias power even during standby, and based on a change of this bias power, the controller 90 may easily detect the variation in the resistance value of the heater 52y in each zone, the variation being caused by the radiant heat RH of the heater 52x being heated.

Here, as illustrated in FIG. 9A, in a case where no film is present on the inner surface of the processing container 10, the radiant heat RH of the heater 52x is smoothly transmitted through the processing container 10 and thus a large amount is transferred to the respective heaters 52y of adjacent zones. Therefore, the resistance value of another zone is changed at a high variation rate due to the radiant heat RH. Whereas, as illustrated in FIG. 9B, in a case where a film is present on the inner surface of the processing container 10, the radiant heat RH of the heater 52 is not easily transmitted through the processing container 10 as compared to in the case where no film is present. Therefore, the resistance value of another zone is changed at a low variation rate.

Accordingly, the controller 90 may also use the change amount of the resistance value of the heater 52 in a zone other than the zone being heated, as the index of the thermal effect of the processing container 10, so as to satisfactorily estimate the film thickness of the film formed on the inner surface of the processing container 10.

In the parameter setting method, of course, like the resistance value, the temperature of the temperature sensor 80 in a zone other than the zone being heated (e.g., the internal temperature sensor 81 and the external temperature sensor 82 of the adjacent zone) may be used as an index of the thermal effect of the processing container 10. As an example, in the parameter setting method, a regression analysis may be performed by using temperatures (variables) of a plurality of zones, so that the film thickness of the zone being heated may be predicted.

Technical ideas and effects of the present disclosure described in the above exemplary embodiment will be described below.

In a first aspect of the present disclosure, a parameter setting method includes: (a) providing a substrate processing apparatus 1 including a processing container 10 that performs the substrate processing to form a film on each of a plurality of substrates W; and the temperature adjustment unit 50 that controls temperatures of the substrates W accommodated within the processing container 10, for each of zones set in advance; (b) acquiring, as reference information, a first index indicating a thermal effect of temperature control of a temperature adjustment unit 50 on the processing container 10 in a state where no film is present on an inner surface of the processing container 10, for each of the zones; (c), after the step (b), acquiring, as the reference information, a film thickness on the inner surface of the processing container 10, and a second index indicating a thermal effect of the temperature control of the temperature adjustment unit 50 on the processing container 10 in a state where a film is present on the inner surface of the processing container 10, for each of the zones; and (d), after the step (c), acquiring a third index indicating a thermal effect of the temperature control of the temperature adjustment unit 50 on the processing container 10 when a film is formed on the inner surface of the processing container 10 by the substrate processing, for each of the zones, and estimating a film thickness of the film formed on the inner surface of the processing container 10 based on the acquired third index and the reference information.

As described above, in the parameter setting method, it is possible to highly accurately estimate film thickness measurement in, for example, set-up substrate processing which is repeatedly performed a plurality of times in starting process conditions. Therefore, in the parameter setting method, it is possible to omit operations such as transportation of a monitoring target substrate W and film thickness measurement of the substrate W, and thus it is possible to search for parameters for process conditions in a short time. Further, the parameter setting method may be realized at no cost because when, for example, the temperature adjustment unit 50 and the temperature sensor 80 previously mounted in the substrate processing apparatus 1 are used, no additional jigs or measuring devices are required.

The step (d) further includes estimating a film thickness of a substrate W in each of the zones is further estimated based on the estimated film thickness on the inner surface of the processing container 10. In this manner, in the parameter setting method, by estimating the film thickness of the substrate W in each of the zones, it is possible to easily search for parameters for inter-surface uniformity of making the film thicknesses of the substrates W uniform.

The step (d) further includes notifying a user of the film thickness of the film formed on the inner surface of the processing container 10 or the film thickness of the substrate W in each of the zones. Thus, the user may easily recognize the film thickness in each zone in the set-up substrate processing, and adjust process conditions.

The parameter setting method further includes (e), after the step (c), calculating temperature adjustment information and/or flow rate information of a processing gas, which make film thicknesses of the substrates uniform for each of the zones, are calculated based on the film thickness on the inner surface of the processing container 10 or the film thickness of the substrate in each of the zones. Thus, the substrate processing apparatus 1 may easily set parameters of inter-surface uniformity.

The first index, the second index, and the third index in each of the zones are temperature change amounts changed with respect to a temperature in a stable state due to the temperature control of the temperature adjustment unit when a temperature of the processing container is detected by a temperature sensor. Therefore, in the parameter setting method, it is possible to smoothly estimate the film thickness on the inner surface of the processing container 10 based on three temperature change amounts.

The first index, the second index, and the third index in each of the zones are resistance values of a heater other than a heater in a zone being heated in the temperature adjustment unit. In this manner, in the parameter setting method, by using the resistance value of the heater as an index, it is also possible to highly accurately estimate the film thickness on the inner surface of the processing container 10.

In the step (b), the step (c), and the step (d), the temperature control by the temperature adjustment unit is performed in the same heater power pattern. Therefore, in the parameter setting method, it is possible to stably acquire thermal effects in a case where the temperature adjustment unit 50 has made the same temperature change in the steps.

The heater power pattern has a change from first power to second power, and in the film thickness estimation, the first index, the second index, and the third index at the same measurement timing that has elapsed from start of a change of the first power are used. As a result, in the parameter setting method, it is possible to obtain thermal effect information pieces associated with the temperature control of the temperature adjustment unit 50 at the same timing, and to highly accurately perform estimation of the film thickness.

The step (b) and the step (c) are performed when the substrate processing apparatus is manufactured, when the substrate processing apparatus is installed or when maintenance of the substrate processing apparatus is performed, and the step (d) is performed when a process condition of the substrate processing are set. Accordingly, in the parameter setting method, it is possible to shorten the time required for setting process conditions.

In a second aspect of the present disclosure, the substrate processing apparatus 1 includes: the processing container 10 that performs substrate processing to form a film on each of a plurality of substrates W; the temperature adjustment unit 50 that controls temperatures of the substrates W accommodated within the processing container 10, for each of zones set in advance; and the controller 90 that controls an operation of the temperature adjustment unit 50. The controller 90 performs (a) acquiring, as reference information, a first index indicating a thermal effect of a temperature control of the temperature adjustment unit 50 on the processing container 10 in a state where a film is absent on an inner surface of the processing container 10, for each of the zones; (b), after the step (a), acquiring, as the reference information, a film thickness of a film on the inner surface of the processing container 10 and a second index indicating a thermal effect of the temperature control of the temperature adjustment unit 50 on the processing container 10 in a state where the film is present on the inner surface of the processing container 10, for each of the zones; and (c), after the step (b), acquiring a third index indicating a thermal effect of the temperature control of the temperature adjustment unit 50 on the processing container 10 when the film is formed on the inner surface of the processing container 10 by the substrate processing, for each of the zones, and estimating a film thickness of the film formed on the inner surface of the processing container 10 based on the acquired third index and the reference information. In this case as well, the substrate processing apparatus 1 may search for parameters of process conditions in a short time.

The substrate processing apparatus 1 of the present disclosure is not limited to the above apparatus, and any film forming apparatus may be applied as long as it forms a film that changes the thermal conductivity of the processing container 10, regardless of the type of the film.

According to one aspect, it is possible to search for parameters of process conditions in a short time.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A parameter setting method comprising:
    (a) providing a substrate processing apparatus including:
        a processing container configured to perform a substrate processing to form a film on each of a plurality of substrates;
        a temperature controller configured to control temperatures of the substrates accommodated within the processing container, for each of zones set in advance; and
        a controller configured to control an operation of the temperature controller,
    (b) acquiring, by the controller and as reference information, a first index indicating a thermal effect on the processing container due to a temperature control of the temperature controller in a state where the film is absent on an inner surface of the processing container, for each of the zones;
    (c) after (b), acquiring, by the controller and as the reference information, a film thickness on the inner surface of the processing container, and a second index indicating a thermal effect on the processing container due to the temperature control of the temperature controller in a state where the film is present on the inner surface of the processing container, for each of the zones;
    (d) after (c), acquiring, by the controller, a third index indicating a thermal effect on the processing container due to the temperature control of the temperature controller when the film is formed on the inner surface of the processing container by the substrate processing, for each of the zones;
    (e) generating, by the controller, a model indicating a relationship between a film thickness of the film formed on the inner surface of the processing container and a film thickness of a substrate in each of the zones;
    (f) estimating, by the controller, the film thickness of the film formed on the inner surface of the processing container based on the third index and the reference information during the substrate processing is performed;
    (g) estimating, by the controller, the film thickness of the substrate in each of the zones based on the film thickness of the film formed on the inner surface of the processing container using the model during the substrate processing is performed;
    (h) calculating, by the controller, at least one of temperature adjustment information and flow rate information of a processing gas, which make film thicknesses of the substrates uniform for each of the zones, based on at least one of the film thickness on the inner surface of the processing container and the film thickness of the substrate in each of the zones, the temperature adjusting information indicating a temperature rise amount or a temperature drop amount in each of the zones; and
    (i) dynamically controlling, by the controller, parameters of a processing condition of the substrate based on a predictive analysis of the at least one of the temperature adjustment information and the flow rate information of the processing gas during the substrate processing is performed,
    wherein the predictive analysis includes a real-time estimation of the film thickness of the substrate in each of the zones using the model generated based on a correlation analysis between the third index and an actual measured film thickness.

2. The parameter setting method according to claim 1, wherein (f) further includes notifying a user of the film thickness of the film formed on the inner surface of the processing container or the film thickness of the substrate in each of the zones.

3. The parameter setting method according to claim 1, wherein the first index, the second index, and the third index in each of the zones are temperature change amounts changed with respect to a temperature in a stable state due to the temperature control of the temperature controller when a temperature of the processing container is detected by a temperature sensor.

4. The parameter setting method according to claim 1, wherein the first index, the second index and the third index in each of the zones are resistance values of a heater other than a heater in a zone being heated in the temperature controller.

5. The parameter setting method according to claim 1, wherein in (b), (c), and (d), the temperature control by the temperature controller is performed in a same heater power pattern.

6. The parameter setting method according to claim 5, wherein the heater power pattern has a change from first power to second power, and in the estimating of the film thickness, the first index, the second index, and the third index at a same measurement timing that has elapsed from start of a change of the first power are used.

7. The parameter setting method according to claim 1, wherein (b) and (c) are performed when the substrate processing apparatus is manufactured, when the substrate processing apparatus is installed, or when maintenance of the substrate processing apparatus is performed.

8. A substrate processing apparatus comprising:
a processing container configured to perform a substrate processing to form a film on each of a plurality of substrates;
a temperature controller configured to control temperatures of the substrates accommodated within the processing container, for each of zones set in advance; and
a controller configured to control an operation of the temperature controller,
wherein the controller performs:
   (a) acquiring, by the controller and as reference information, a first index indicating a thermal effect on the processing container due to a temperature control of the temperature controller in a state where the film is absent on an inner surface of the processing container, for each of the zones;
   (b) after (a), acquiring, by the controller and as the reference information, a film thickness on the inner surface of the processing container, and a second index indicating a thermal effect on the processing container due to the temperature control of the temperature controller in a state where the film is present on the inner surface of the processing container, for each of the zones;
   (c) after (b), acquiring, by the controller, a third index indicating a thermal effect on the processing container due to the temperature control of the temperature controller when the film is formed on the inner surface of the processing container by the substrate processing, for each of the zones;
   (d) generating, by the controller, a model indicating a relationship between a film thickness of the film formed on the inner surface of the processing container and a film thickness of a substrate in each of the zones;
   (e) estimating, by the controller, the film thickness of the film formed on the inner surface of the processing container based on the third index and the reference information;
   (f) estimating, by the controller, the film thickness of the substrate in each of the zones based on the film thickness of the film formed on the inner surface of the processing container using the model;
   (g) calculating, by the controller, at least one of temperature adjustment information and flow rate information of a processing gas, which make film thicknesses of the substrates uniform for each of the zones, based on at least one of the film thickness on the inner surface of the processing container and the film thickness of the substrate in each of the zones, the temperature adjusting information indicating a temperature rise amount or a temperature drop amount in each of the zones; and
   (h) dynamically controlling, by the controller, parameters of a processing condition of the substrate based on a predictive analysis of the at least one of the temperature adjustment information and flow rate information of a processing gas during the substrate processing is performed,
wherein the predictive analysis includes a real-time estimation of the film thickness of the substrate in each of the zones using the model generated based on a correlation analysis between the third index and an actual measured film thickness.

* * * * *